(12) United States Patent
Mugler, III et al.

(10) Patent No.: US 9,360,545 B2
(45) Date of Patent: Jun. 7, 2016

(54) MAGNETIC RESONANCE SYSTEM AND OPERATING METHOD FOR FLOW ARTIFACT REDUCTION IN SLAB SELECTIVE SPACE IMAGING

(75) Inventors: John P. Mugler, III, Charlottesville, VA (US); Dominik Paul, Bubenreuth (DE)

(73) Assignees: Siemens Aktiengesellschaft, Munich (DE); University of Virginia Patent Foundation, Charlottesville, VA (US)

(*) Notice: Subject to any disclaimer, the term of this patent is extended or adjusted under 35 U.S.C. 154(b) by 849 days.

(21) Appl. No.: 13/533,371

(22) Filed: Jun. 26, 2012

(65) Prior Publication Data
US 2013/0342202 A1 Dec. 26, 2013

(51) Int. Cl.
*G01R 33/561* (2006.01)
*G01R 33/565* (2006.01)

(52) U.S. Cl.
CPC ...... *G01R 33/5617* (2013.01); *G01R 33/56509* (2013.01)

(58) Field of Classification Search
CPC ............... G01R 33/5617; G01R 33/56509
See application file for complete search history.

(56) References Cited

U.S. PATENT DOCUMENTS

| | | | | |
|---|---|---|---|---|
| 4,894,616 A * | 1/1990 | Yoshitome et al. | ........... | 324/309 |
| 5,402,787 A * | 4/1995 | Van Yperen | ....... | G01R 33/5615 324/309 |
| 5,410,249 A * | 4/1995 | Van Yperen | ....... | G01R 33/5615 324/307 |
| 6,265,872 B1 * | 7/2001 | Heid | ................ | G01R 33/56341 324/307 |
| 6,310,478 B1 * | 10/2001 | Heid | ................ | G01R 33/5613 324/307 |
| 6,366,090 B1 * | 4/2002 | Heid | ................ | G01R 33/5615 324/307 |
| 6,946,839 B2 * | 9/2005 | Porter | ................ | G01R 33/5615 324/307 |
| 7,205,763 B2 * | 4/2007 | Porter | .............. | G01R 33/56341 324/306 |
| 7,705,597 B2 | 4/2010 | Horger et al. | | |
| 7,863,895 B2 * | 1/2011 | Ma | .......... | A61B 5/417 324/309 |
| 8,093,895 B2 * | 1/2012 | Umeda | ............. | G01R 33/4828 324/307 |
| 8,710,838 B2 * | 4/2014 | Miyazaki | ............. | G01R 33/482 324/309 |
| 8,779,767 B2 * | 7/2014 | Umeda | ............. | G01R 33/4828 324/307 |
| 8,947,085 B2 * | 2/2015 | Feiweier | .......... | G01R 33/56341 324/309 |
| 9,078,589 B2 * | 7/2015 | Kassai | .................. | A61B 5/055 |
| 2008/0150530 A1 | 6/2008 | Miyoshi | | |
| 2008/0150531 A1 | 6/2008 | Hughes et al. | | |
| 2008/0315876 A1 | 12/2008 | Miyoshi | | |
| 2008/0319301 A1 * | 12/2008 | Busse | .......................... | 600/410 |
| 2009/0230957 A1 | 9/2009 | Park | | |
| 2010/0280357 A1 | 11/2010 | Bi et al. | | |

FOREIGN PATENT DOCUMENTS

CN 101401723 A 4/2009

OTHER PUBLICATIONS

Fat-signal Suppression in Single-slab 3D TSE (SPACE) using Water-Selective Refocusing, Mugler, III et al. Proc. Intl. Soc. Mag. Reson. Med., vol. 19 (2011) p. 2818.

* cited by examiner

*Primary Examiner* — Dixomara Vargas
(74) *Attorney, Agent, or Firm* — Schiff Hardin LLP

(57) ABSTRACT

In a SPACE (Sampling Perfection with Application optimized Contrasts using different flip angle Evolutions) or equivalent magnetic resonance imaging pulse sequence, the dephasing gradient is generated (activated) so as to occur immediately in front of the second refocusing pulse, thereby eliminating the long time duration that occurs in conventional SPACE or equivalent sequences between excitation and readout. This long time duration has been identified as a source for flow-related artifacts that occur in images reconstructed from data acquired according to conventional SPACE or equivalent sequences. By eliminating this long time duration, such flow-related artifacts are substantially reduced, if not eliminated.

16 Claims, 8 Drawing Sheets

Artifact-Containing Region

FIG. 7
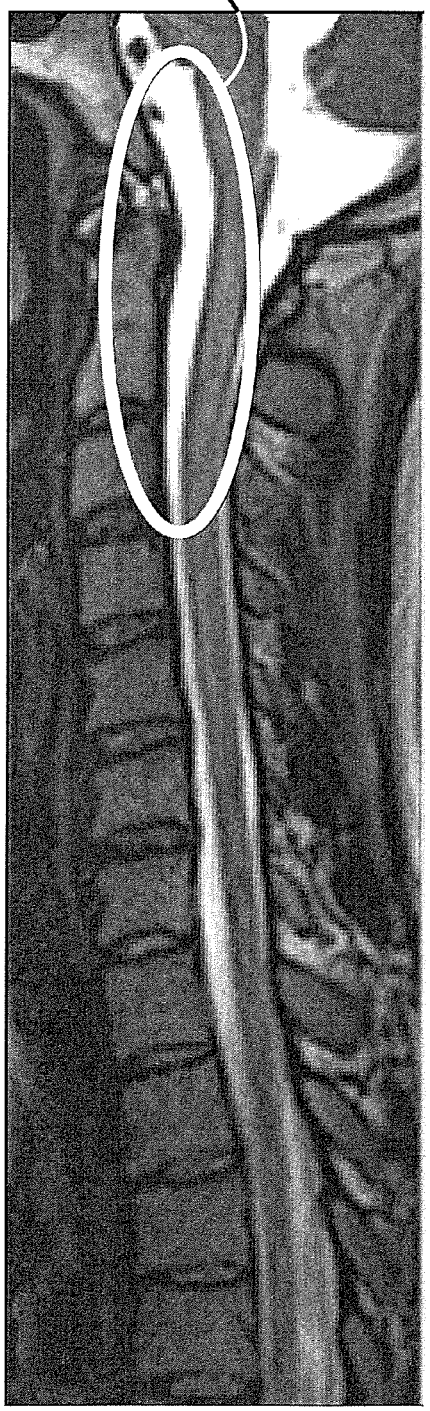
Artifact-Free Region
Shifted Dephaser
Artifact-Containing Region
Conventional

MAGNETIC RESONANCE SYSTEM AND OPERATING METHOD FOR FLOW ARTIFACT REDUCTION IN SLAB SELECTIVE SPACE IMAGING

BACKGROUND OF THE INVENTION

1. Field of the Invention

The present invention concerns a magnetic resonance system and an operating method therefor of the type wherein magnetic resonance data are acquired according to a SPACE (Sampling Perfection with Application optimized Contrasts using different flip angle Evolutions) or equivalent pulse sequence, and in particular to such a system and method for flow artifact reduction in slab selective SPACE imaging.

2. Description of the Prior Art

Highly sophisticated spin-echo pulse sequences include a single-slab 3D turbo or fast spin-echo pulse sequence known, for example, as SPACE. Pulse sequences of this type allow an extremely large number of refocusing RF pulses (such as more than 300) by using a refocusing RF pulse train exhibiting pulses with respectively different flip angles throughout the duration of the echo train. The curve that represents the variation of the flip angles is designed to achieve desired signal strengths for different types of tissue (nuclear spins), and is referred to as the flip angle evolution. Such an evolution is usually designed for obtaining a specific contrast (such as in proton density-weighted images or T1-weighted images or T2-weighted images) between the tissues in the image. Such an imaging sequence can be used effectively in brain imaging, for example, wherein cerebral-spinal fluid (CSF), gray matter and white matter all exhibit markedly different signal intensities in T2-weighted images. Using the SPACE sequence, an optimal T2-weighted contrast among the various tissues can be obtained by setting the echo time around the middle portion of the echo train.

A basic description of single slab SPACE imaging can found, for example, in U.S. Pat. No. 7,705,597 and in the article "Fat-Signal Suppression in Single-Slab 3D TSE (SPACE) Using Water-Selective Refocusing," Mugler, III et al., Proc. Intl. Soc. Mag. Reson. Med., Vol. 19 (2011), page 2818.

In slab-selective SPACE imaging, flow-related artifacts often occur in the readout direction, for example, in spine imaging due to the CSF flow. An example of such a flow-related artifact can be seen in FIG. 1, in the outlined region. In contrast to the phase-encoding direction, this problem primarily occurs in the readout direction, because this direction is more sensitive to flow.

In an effort to address this problem, imaging sequence protocols are configured with the phase-encoding direction being aligned with the cranio-caudal or head-to-feet axis of the patient. This means, however, that a large number of phase-encoding steps are needed to cover the field of view (FOV) of interest, and a large number of phase-encoding steps are necessary for oversampling (normally about 50% to 80%), in order to avoid infolding artifacts. These factors result in a very long acquisition time when such imaging sequences are used. This situation is illustrated in FIG. 2, which shows a portion of the pulse-sequence elements for a conventional single slab SPACE imaging sequence in which the RF excitation pulse is shown at the top left, followed by the refocusing RF pulses of varying amplitude (labeled "RF signal"). The sequence for the X gradient is shown below, with a relatively long time duration between the dephasing gradient and the first application of a readout gradient, during which gradient data acquisition may occur. For completeness, the Z gradient is shown in FIG. 2 as well, below the X gradient.

SUMMARY OF THE INVENTION

An object of the present invention is to provide a magnetic resonance imaging system and an operating method therefor wherein the aforementioned flow-related artifacts in SPACE or equivalent imaging are significantly reduced. A further object of the present invention is to provide a non-transitory, computer-readable data storage medium that, when loaded into a computerized processor that controls operation of magnetic resonance imaging system, causes such a method to be implemented in the operation of the magnetic resonance system.

The magnetic resonance system and operating method in accordance with the present invention are based on the insight that the aforementioned flow related artifacts in single slab SPACE imaging arise due to the aforementioned long time duration between the dephasing gradient, applied in the readout direction, and the first application of a readout gradient, that occurs directly after the excitation RF pulse. Due to the long duration of the excitation RF pulse compared to the subsequent RF pulses, the first echo spacing (ESP) is very long, resulting in the aforementioned long time duration between the dephasing gradient and the first application of a readout gradient, thereby making the sequence overly sensitive to flow in the readout direction. In other words, due to said long time duration, the net effect of the dephasing gradient and first application of a readout gradient on the excited (transverse) magnetization of moving nuclear spins may be, depending on the degree of motion, substantially different than that corresponding to stationary nuclear spins, which leads to a motion-induced phase difference in the detected magnetic resonance signal from moving nuclear spins. This is the source of the signal voids that can be seen in FIG. 1, resulting from the conventional single slab SPACE sequence shown in FIG. 2. In the method according to the present invention, therefore, magnetic resonance imaging data are acquired by operating a magnetic resonance imaging system with a single slab SPACE or equivalent imaging sequence wherein the dephasing gradient is shifted from its conventional position after the excitation RF pulse in order to instead be activated immediately in front of the second refocusing RF pulse, replacing the application of the readout gradient just before the second refocusing RF pulse in the conventional pulse sequence. Thus data is not measured just before the second refocusing RF pulse.

In a further embodiment of the inventive method, in order to reduce sensitivity to inhomogeneities in the basic magnetic field ($B_0$ inhomogeneities), spoiler gradients are activated around the first refocusing pulse on the Z-axis. In a further embodiment, such spoiler gradients can also be activated along the Y-axis and the X-axis. This latter embodiment is particularly useful in other SPACE variants, such as inner volume SPACE, or SPACE with a water-selective first refocusing pulse.

BRIEF DESCRIPTION OF THE DRAWINGS

FIG. 7 shows further images for comparison between single slab selective SPACE imaging according to the invention, and conventional single slab SPACE imaging.

DESCRIPTION OF THE PREFERRED EMBODIMENTS

Figure 8:
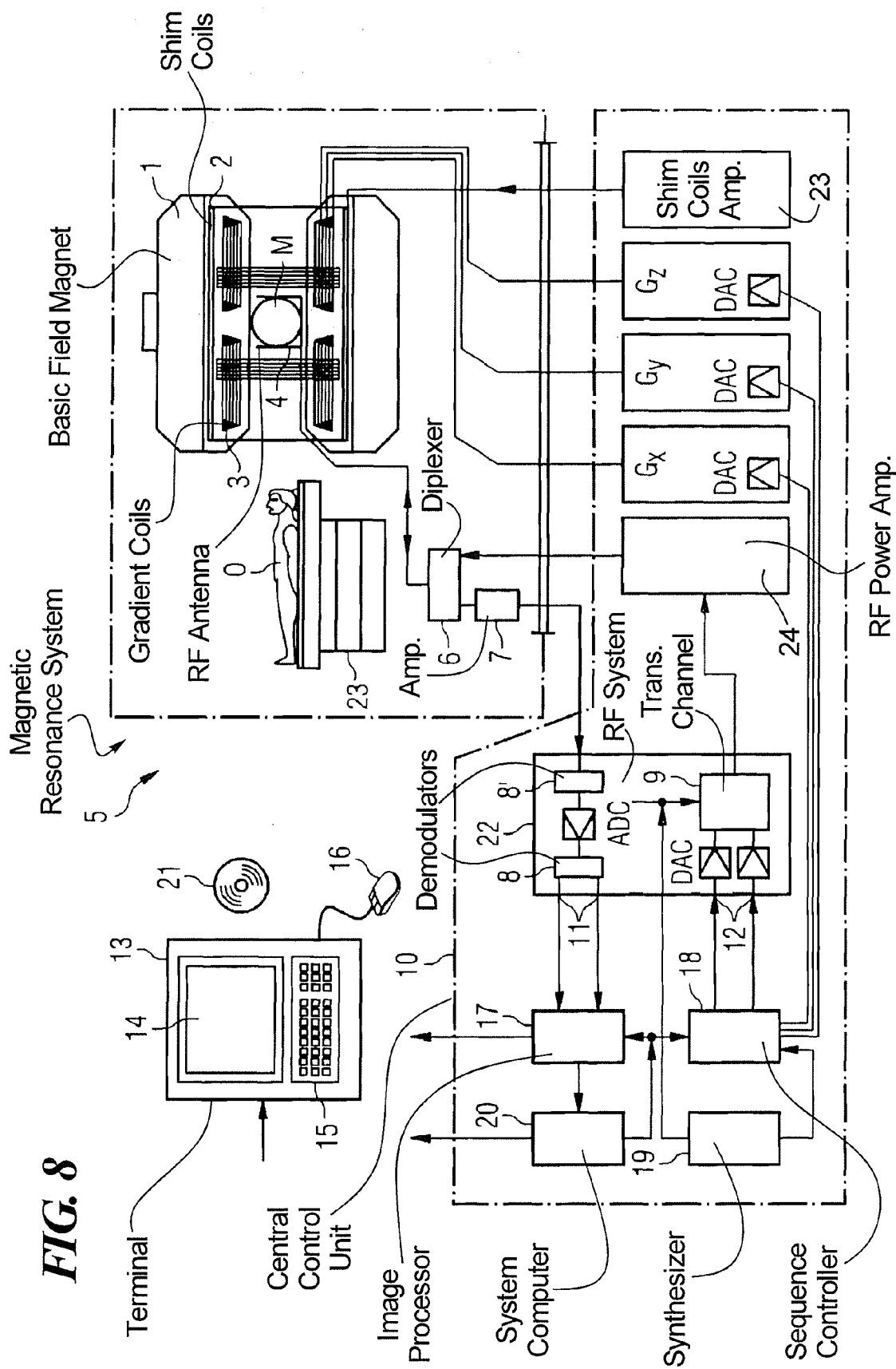
FIG. 8 schematically illustrates a magnetic resonance imaging system constructed and operating according to the present invention.

Turning first to FIG. 8, FIG. 8 is a schematic representation of a magnetic resonance system 5 and a central control unit 10 as can be used both for nuclear magnetic resonance imaging and for magnetic resonance spectroscopy. FIG. 8 is meant only to represent an exemplary magnetic resonance imaging/spectroscopy system, whereas the present invention applies to any of the many permutations of such a system for magnetic resonance imaging/spectroscopy that are used in the field.

A basic field magnet field 1 generates a temporally constant strong magnetic field $B_0$ for polarization or for alignment of the nuclear spins in a region under investigation of an object O, such as, for example, a part of a human body to be examined, the part being shifted on a table 23 lying in the magnetic resonance system 5. The high homogeneity of the fundamental magnetic field required for nuclear spin resonance tomography is defined in a measurement volume M. For support of the homogeneity requirements and in particular for the elimination of time invariable influences, shims made of ferromagnetic material are mounted at a suitable location. Time variable influences are eliminated by shim coils 2 according to signals from shim coils amplifier 23.

A cylindrical gradient coil system 3 is inserted into the fundamental field magnet 1, composed of three windings. The windings are provided with power by respective amplifiers for the generation of linear (also time modifiable) gradient field in the respective directions of the Cartesian coordinate system. The first winding of the gradient field system 3 generates a gradient Gx in the x-direction, the second winding generates a gradient Gy in the y-direction and the third winding generates a gradient Gz in the z-direction. Each amplifier has a digital-to-analog converter that is controlled by a sequence controller 18 for the generation of gradient pulses at the correct time.

Located within the gradient field system 3 is one (or more) radio-frequency (RF) antenna 4, which convert the high frequency pulses emitted by a radio frequency power amplifier 24 to a magnetic AC field for excitation of the nuclear spins and alignment of the nuclear spins of the object O to be examined or of the region to be examined of the object O. Each high frequency antenna 4 has one or more RF transmission coils and one or more RF reception coils in the shape of an annular, preferably linear or matrix-shaped arrangement of component coils. From the RF reception coils of the respective high frequency antenna 4 the AC field proceeding from the precessing nuclear spin, usually the nuclear spin echo signals generated from a pulse sequence of one or more high frequency pulses and one or more gradient pulses, is also converted into a voltage (measurement signal) that is fed via an amplifier 7 to a high frequency receive channel 8 of a high frequency system 22. The high frequency system 22 additionally has a transmission channel 9 in which the high frequency pulses are generated for the excitation of the nuclear magnetic resonance. In the process the respective high frequency pulses are digitally represented as a sequence of complex numbers on the basis of a pulse sequence in the sequence controller 18 predefined by the system computer 20. This number sequence is fed as a real part and as an imaginary part via inputs 12 to a digital analog converter in the high frequency system 22 and from the system 22 to a transmission channel 9. In the transmission channel 9 the pulse sequences are modulated to a high frequency carrier signal whose basic frequency corresponds to the resonance frequency of the nuclear spin in the measurement volume.

The switchover between send-receive modes occurs via a diplexer 6. The RF transmission coils of the high frequency antenna(e) 4 irradiate the high frequency pulses for excitation of the nuclear spin to the measurement volume M and resulting echo signals are scanned via the RF reception coil(s). The obtained nuclear resonance signals are phase-sensitively demodulated in the receive channel 8' (first demodulator) of the high frequency system 22 to an intermediate frequency and are digitized in the analog-digital converter (ADC). This signal is also demodulated to the basic frequency. The demodulation to the basic frequency and the separation into real and imaginary parts at outputs 11 takes place, after the digitization, in the digital domain in a second demodulator 8. An image processor 17 reconstructs an MR image from the measurement data obtained in such a way. The administration of the measurement data, the image data and of the control programs occurs via a system computer 20. By means of a specification with control programs the sequence controller 18 controls the generation of the respective desired pulse sequences and the corresponding scanning of the k-space.

The sequence controller 18 controls the switching of the gradients at the correct time, the transmission of the high frequency pulses with defined phase amplitude as well as the reception of the nuclear resonance signals. The time base for the high frequency system 22 and the sequence controller 18 are made available by a synthesizer 19. The selection of corresponding control programs for the generation of an MR image, said control programs being e.g. stored on a DVD 21, as well as the representation of the generated MR image occurs via a terminal 13 comprising a keyboard 15, a mouse 16 and a monitor 14.

Figure 1:
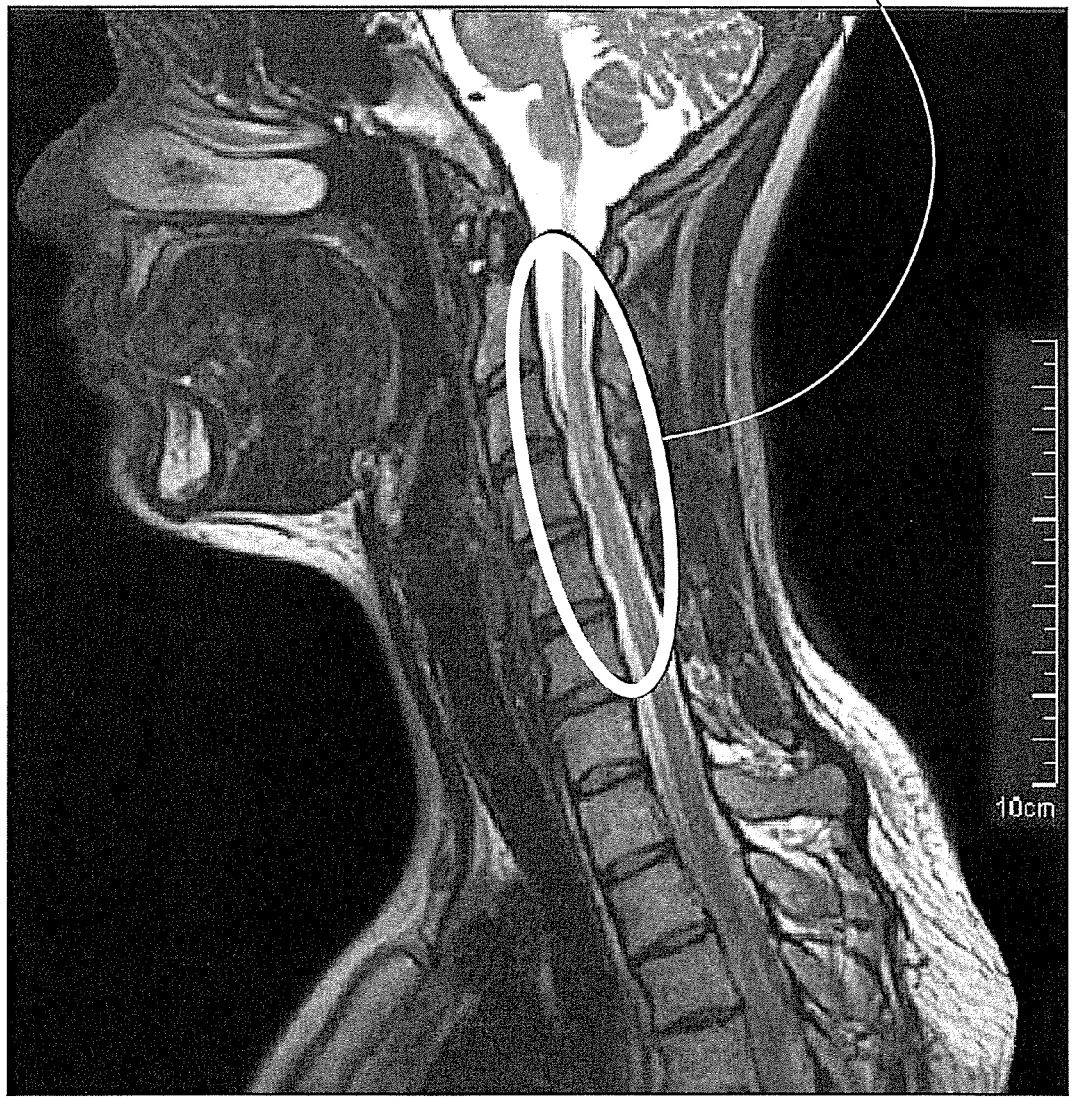
FIG. 1, as noted above, is an image obtained with a conventional single slab selective SPACE imaging sequence, embodying flow-related artifacts.
Figure 2:
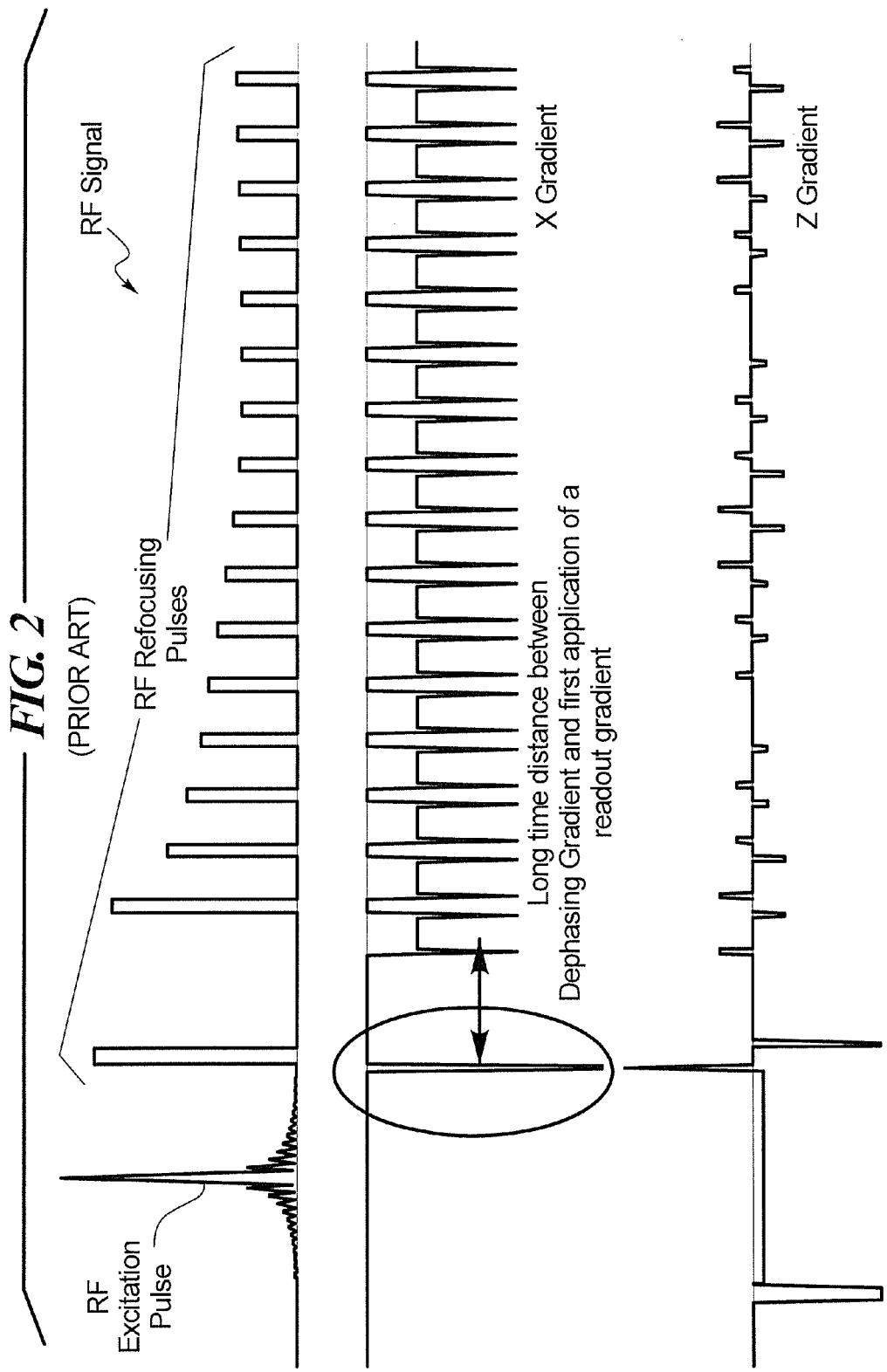
FIG. 2 schematically illustrates a portion of the pulse-sequence elements for a conventional single slab selective SPACE imaging sequence.
Figure 3:
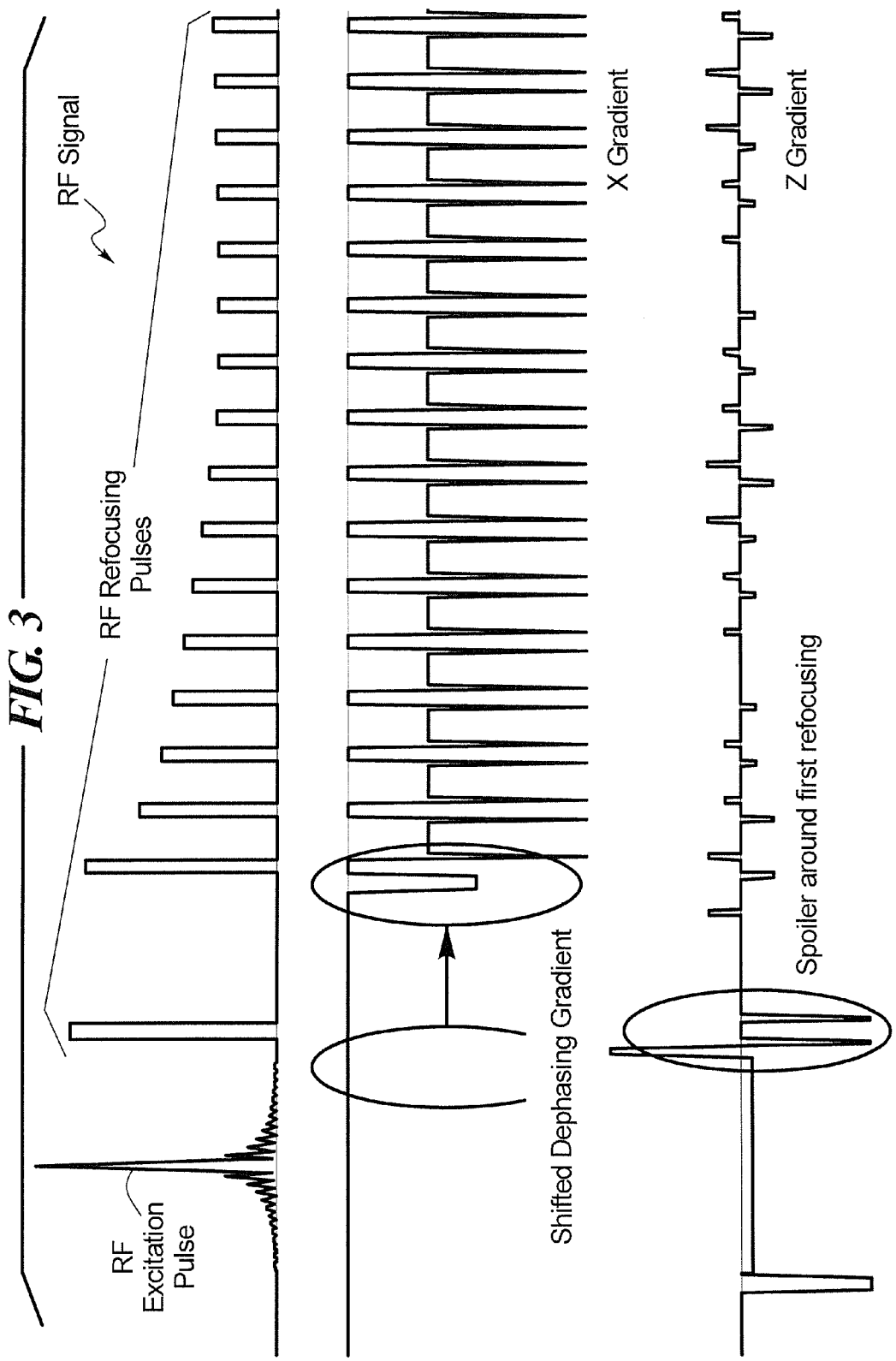
FIG. 3 schematically illustrates analogous pulse sequence elements for a single slab SPACE imaging sequence according to the present invention.

FIG. 3 schematically illustrates a single slab selective SPACE imaging sequence according to the present invention wherein the dephasing gradient has been shifted from its conventional position following the excitation RF pulse to a position that immediately precedes the second refocusing RF pulse. The long time duration between the dephasing gradient and readout thus no longer occurs, and the flow-related artifacts that result from that long time duration no longer occur, or are significantly reduced, in magnetic resonance images that are reconstructed from the data acquired according to the imaging sequence shown in FIG. 3.

Figure 4:
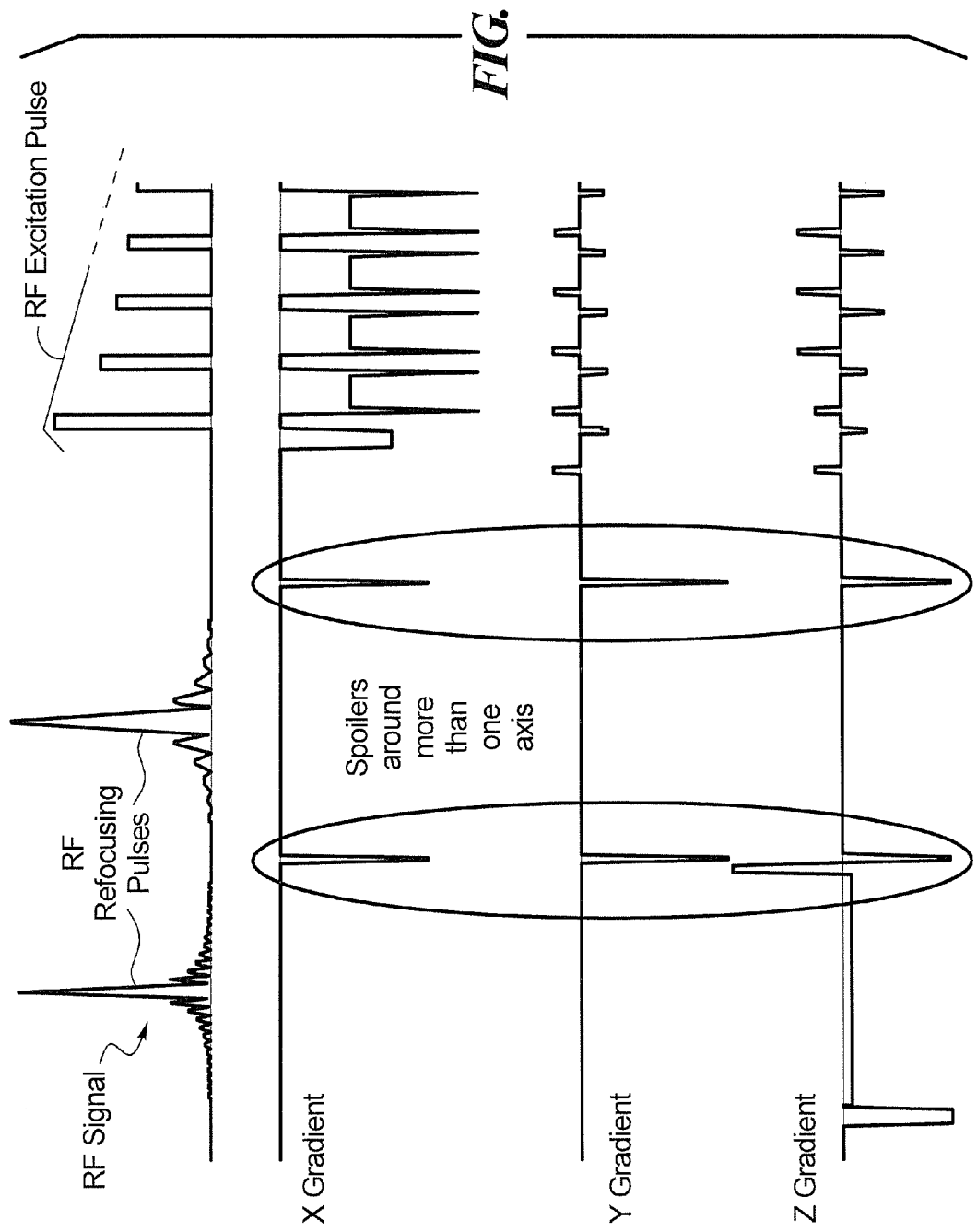
FIG. 4 schematically illustrates a further embodiment of the single slab SPACE imaging sequence according to the present invention.

FIG. 3 also shows a further embodiment of the invention wherein spoiler gradients are added around the first refocusing pulse. Spoilers can be added around the refocusing RE pulses on more than one axis, as shown in FIG. 4.

Figure 5:
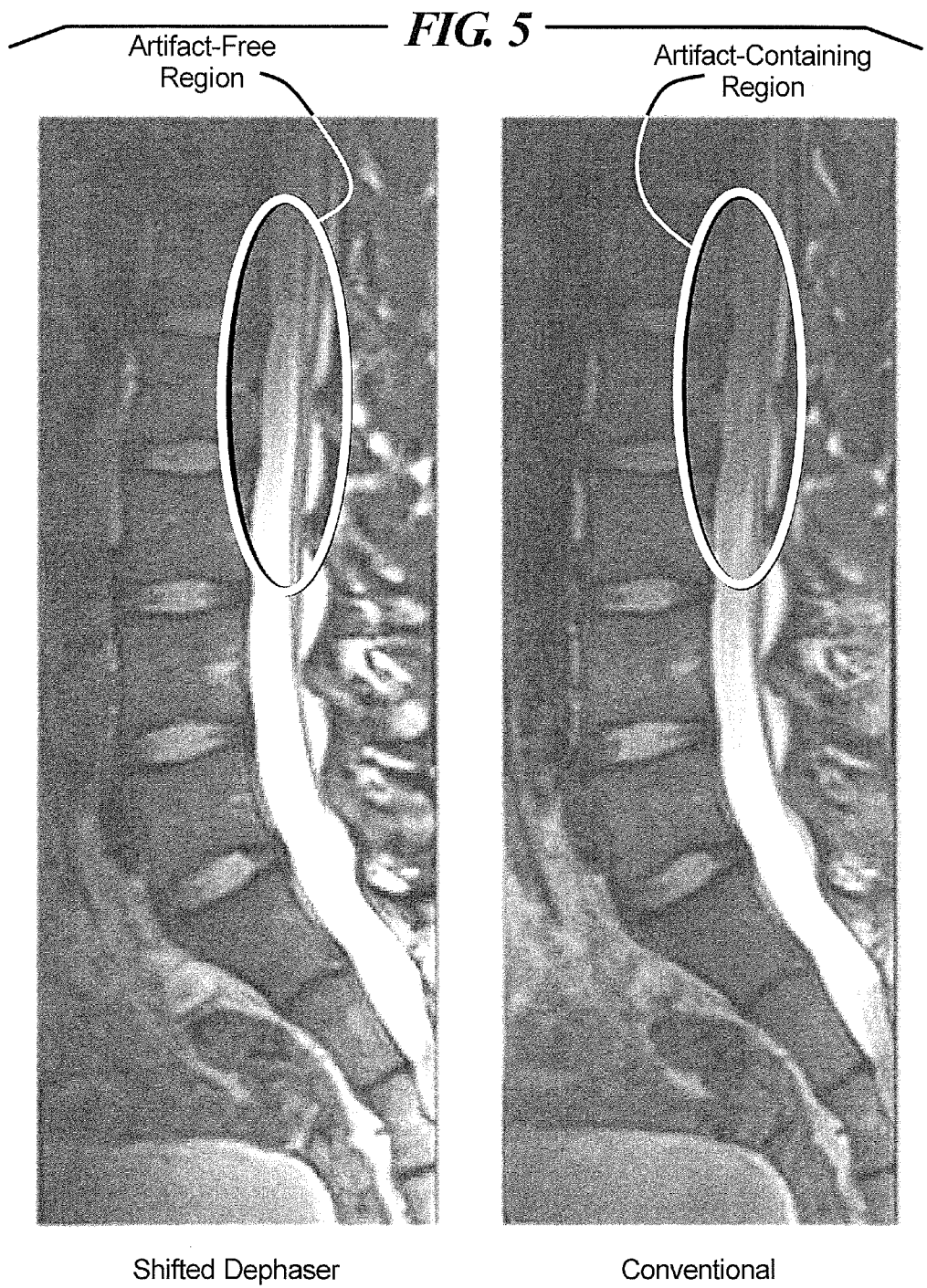
FIG. 5 shows two images for comparison between conventional single slab selective SPACE imaging and single slab selective SPACE imaging according to the present invention.
Figure 6:
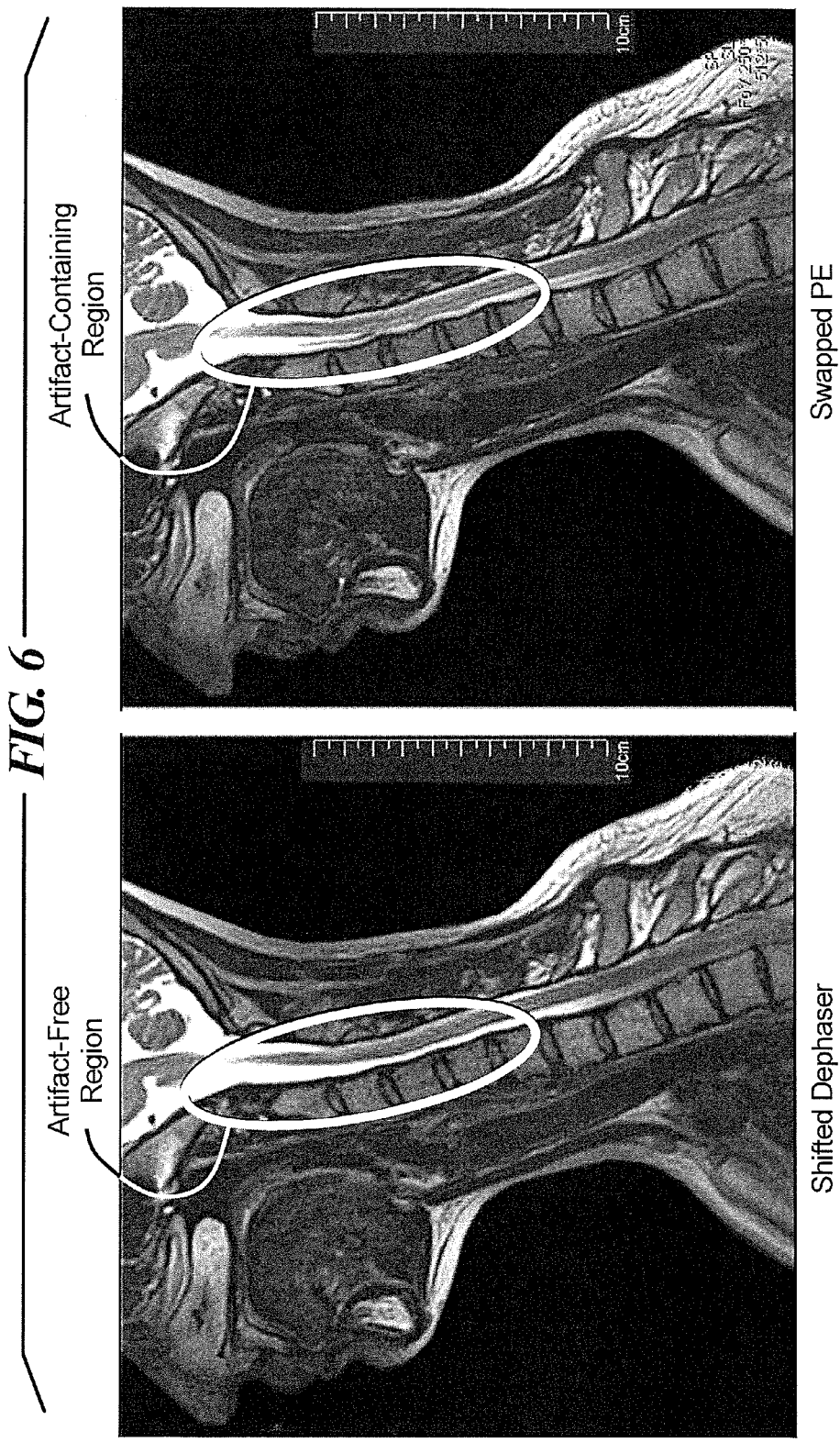
FIG. 6 shows two images for comparison between single slab selective SPACE imaging according to the present invention, and single slab selective SPACE imaging with swapped phase encoding.

FIGS. 5, 6 and 7 show, for comparison purposes, magnetic resonance images reconstructed according to data acquired with a conventional single slab selective SPACE imaging sequence, and data acquired with the single slab selective SPACE imaging sequence according to the invention. The outlined portion of each image shows the region of interest in which, in the conventionally-generated images, flow-related artifacts are visible. In the outlined regions of the images obtained according to the invention, such artifacts are virtually non-existent.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a magnetic resonance image, comprising:
    operating a magnetic resonance image data acquisition unit according to an imaging pulse sequence comprising an excitation radio-frequency (RF) pulse and a plurality of refocusing RF pulses temporally following said excitation RF pulse, said plurality of refocusing RF pulses including a first refocusing RF pulse and a second refocusing RF pulse;
    also operating said magnetic resonance image data acquisition unit in said imaging pulse sequence to shorten a time between dephasing of signals and readout of magnetic resonance data, by activating no dephasing gradient between said excitation RF pulse and said first refocusing RF pulse, and by activating a dephasing gradient in a readout direction between said first refocusing RF pulse and said second refocusing RF pulse and, not until after said second refocusing RF pulse, activating a readout gradient in said readout direction and, during said readout gradient, reading out magnetic resonance data from an object, animal or human subject, with a substance therein exhibiting a flow, exposed to said imaging pulse sequence in said magnetic resonance data acquisition unit; and
    supplying said magnetic resonance data to a computerized processor and, in said computerized processor, reconstructing a magnetic resonance image from said magnetic resonance data that is substantially free of artifacts related to said flow because of the shortened time between said dephasing gradient and reading out said magnetic resonance data with said readout gradient, and making said magnetic resonance image available as a data file at an output of said computerized processor.

2. The method as claimed in claim 1 comprising activating said readout dephasing gradient immediately preceding said second refocusing RF pulse.

3. The method as claimed in claim 1 comprising orienting said human subject in said magnetic resonance data acquisition unit with the head-to-feet axis of the subject aligned with the Z-axis of a Cartesian coordinate system, and generating said readout dephasing gradient along said Z-axis of said Cartesian coordinate system.

4. The method as claimed in claim 1 comprising activating said readout dephasing gradient along an axis of a Cartesian coordinate system, and phase encoding said magnetic resonance signals along a perpendicular axis.

5. The method as claimed in claim 1 comprising generating said readout dephasing gradient along an axis of a Cartesian coordinate system, and activating spoiler pulses along said axis around said first refocusing RF pulse.

6. The method as claimed in claim 5 comprising also activating spoiler gradients along at least one other axis of said Cartesian coordinate system.

7. The method as claimed in claim 1 comprising operating said magnetic resonance image data acquisition unit with a Sampling Perfection with Application Optimized Contrasts using different flip angle Evolutions (SPACE) pulse sequence as said imaging pulse sequence, but with no readout dephasing gradient between said excitation RF pulse and said first refocusing RF pulse.

8. A magnetic resonance imaging system comprising:
    a magnetic resonance data acquisition unit configured to receive an object, animal or human subject therein, said object, animal or human subject containing a substance exhibiting a flow;
    a control unit configured to operate said magnetic resonance image data acquisition unit according to an imaging sequence comprising an excitation radio-frequency (RF) pulse and a plurality of refocusing RF pulses temporally following said excitation RF pulse, said plurality of refocusing RF pulses including a first refocusing RF pulse and a second refocusing RF pulse;
    said control unit being configured, in said imaging pulse sequence, to shorten a time between dephasing of signals and readout of magnetic resonance data by activating no dephasing gradient between said excitation RF pulse and said first refocusing RF pulse, and by activating a dephasing gradient in a readout direction between said first refocusing RF pulse and said second refocusing RF pulse and, not until after said second refocusing RF pulse, activating a readout gradient in said readout direction and, during said readout gradient, to read out magnetic resonance data from the object, animal or human subject exposed to said imaging pulse sequence in said magnetic resonance data acquisition unit; and
    a processor supplied with said magnetic resonance data and configured to reconstruct a magnetic resonance image from said magnetic resonance data that is substantially free of artifacts related to said flow because of the shortened time between said dephasing gradient and reading out said magnetic resonance data with said readout gradient, and to make said magnetic resonance image available as a data file at an output of said processor.

9. The magnetic resonance system as claimed in claim 8 wherein said control unit is configured to operate said data acquisition unit to activate said readout dephasing gradient immediately preceding said second refocusing RF pulse.

10. The magnetic resonance system as claimed in claim 8 wherein the human subject is oriented in said magnetic resonance data acquisition unit with the head-to-feet axis of the subject aligned with the Z-axis of a Cartesian coordinate system, and wherein said control unit is configured to operate said data acquisition unit to generate said readout dephasing gradient along said Z-axis of said Cartesian coordinate system.

11. The magnetic resonance system as claimed in claim 8 wherein said control unit is configured to operate said data acquisition unit to activate said readout dephasing gradient along an axis of a Cartesian coordinate system, and to activate a phase-encoding gradient that phase encodes said magnetic resonance signals along a perpendicular axis.

12. The magnetic resonance system as claimed in claim 8 wherein said control unit is configured to operate said data acquisition unit to generate said readout dephasing gradient along an axis of a Cartesian coordinate system, and to activate spoiler pulses along said axis around said first refocusing RF pulse.

13. The magnetic resonance system as claimed in claim 12 wherein said control unit is configured to operate said data acquisition unit to also activate spoiler gradients along at least one other axis of said Cartesian coordinate system.

14. The magnetic resonance imaging system as claimed in claim 8 wherein said control unit is configured to operate said magnetic resonance image data acquisition unit with a Sampling Perfection with Application Optimized Contrasts using different flip angle Evolutions (SPACE) pulse sequence as said imaging pulse sequence, but with no readout dephasing gradient between said excitation RF pulse and said first refocusing RF pulse.

15. A non-transitory, computer-readable data storage medium encoded with programming instructions, said data storage medium being loaded into a computerized processing and control system of a magnetic resonance imaging system, said magnetic resonance imaging system comprising a magnetic resonance data acquisition unit, and said programming instructions causing said computerized control and evaluation system to:
   operate said magnetic resonance image data acquisition unit according to an imaging sequence comprising an excitation radio-frequency (RF) pulse and a plurality of refocusing RF pulses temporally following said excitation RF pulse, said plurality of refocusing RF pulses including a first refocusing RF pulse and a second refocusing RF pulse;
   in said imaging pulse sequence, shorten a time between dephasing of signals and readout of magnetic resonance data by activating no dephasing gradient between said excitation RF pulse and said first refocusing RF pulse, and and by activating a readout dephasing gradient in a readout direction between said first refocusing RF pulse and said second RF refocusing pulse and, not until after said second refocusing RF pulse, by activating a readout gradient in said readout direction and, during said readout gradient, read out magnetic resonance data from an object, animal or human subject, with a substance therein exhibiting a flow, exposed to said imaging pulse sequence in said magnetic resonance data acquisition unit; and
   reconstruct a magnetic resonance image from said magnetic resonance data that is substantially free of artifacts related to said flow because of the shortened time between said dephasing gradient and reading out said magnetic resonance data with said readout gradient, and make said magnetic resonance image available as a data file at an output.

16. The non-transitory, computer-readable data storage medium as claimed in claim 15 wherein said programming instructions cause said computerized control and evaluation system to operate said magnetic resonance image data acquisition unit with a Sampling Perfection with Application Optimized Contrasts using different flip angle Evolutions (SPACE) pulse sequence as said imaging pulse sequence, but with no readout dephasing gradient between said excitation RF pulse and said first refocusing RF pulse.

* * * * *